United States Patent
Krikhaar et al.

(10) Patent No.: US 6,822,730 B2
(45) Date of Patent: Nov. 23, 2004

(54) SUBSTRATE HOLDER AND DEVICE MANUFACTURING METHOD

(75) Inventors: Johannes Wilhelmus Maria Krikhaar, Veldhoven (NL); Hubertus Jacobus Maria Van Beijsterveldt, Breda (NL); Arthur Winfried Eduardus Minnaert, Veldhoven (NL); Maurice Anton Jaques Teuwen, Heel (NL); Joeri Lof, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/615,598

(22) Filed: Jul. 9, 2003

(65) Prior Publication Data

US 2004/0052031 A1 Mar. 18, 2004

(30) Foreign Application Priority Data

Jul. 11, 2002 (EP) .............................. 02254878

(51) Int. Cl.$^7$ ............................ G03B 27/58; G03B 27/62
(52) U.S. Cl. ............................................ 355/72; 355/75
(58) Field of Search ............................... 355/53, 72–76; 310/10, 12

(56) References Cited

U.S. PATENT DOCUMENTS

| | | | | | |
|---|---|---|---|---|---|
| 5,441,911 A | * | 8/1995 | Malhi | .......................... | 438/285 |
| 5,820,329 A | * | 10/1998 | Derbinski et al. | ...... | 414/225.01 |
| 6,164,633 A | * | 12/2000 | Mulligan et al. | .............. | 269/21 |
| 6,258,228 B1 | * | 7/2001 | Reiss | ..................... | 204/298.15 |
| 2003/0211813 A1 | * | 11/2003 | Kassir et al. | .................. | 451/28 |

FOREIGN PATENT DOCUMENTS

| | | | |
|---|---|---|---|
| EP | 1136887 A2 | * | 9/2001 |
| EP | 1 136 887 A2 | | 9/2001 |
| JP | 3-102849 | | 4/1991 |
| JP | 6-120131 | | 4/1994 |
| JP | 2002-151439 | | 5/2002 |
| JP | 2002151439 | * | 5/2002 |

\* cited by examiner

*Primary Examiner*—Henry Hung Nguyen
(74) *Attorney, Agent, or Firm*—Pillsbury Winthrop LLP

(57) ABSTRACT

A substrate holder to adapt a small wafer to a wafer table of a lithographic apparatus adapted to receive a larger wafer includes a plate member with a burl pattern on which the small wafer is to be placed, positioning pins to locate the small wafer and a clamp formed by a clamp ring and magnets attached to the plate member.

18 Claims, 4 Drawing Sheets

SUBSTRATE HOLDER AND DEVICE MANUFACTURING METHOD

RELATED APPLICATION

This application claims the benefit of priority to European Patent Application No. 02254878.8, filed Jul. 11, 2002, the contents of which are herein incorporated by reference.

BACKGROUND OF THE INVENTION

1. Field of the Invention

The present invention relates to a lithographic projection apparatus, a substrate holder and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a fame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-0672504.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

Silicon wafers used for manufacture of semiconductor for devices come in standard sizes, 150 mm, 200 mm, 300 mm (often referred to by their approximate size in inches -6", 8" and 12") and the larger sizes are becoming increasingly popular because more devices can be manufactured on a single wafer, reducing the number wafer exchange steps and increasing throughput. Lithographic apparatus, and other apparatus used in semiconductor manufacture, are designed to work with these standard wafer sizes. In general, a lithographic apparatus will accept wafers of only one standard size. In spite of the general preference for larger wafer sizes, in some specialized fields it is desirable to be able to manufacture on wafers that are smaller and thinner than the standard sizes mentioned above. It is, however, uneconomical to manufacture or adapt lithographic apparatus to accommodate such small and thin wafers.

Silicon wafers of the type discussed are usually very thin (for example 100 to 350 $\mu$m, e.g. 140 $\mu$m) and because of this tend to curve substantially under their own weight. When making exposures on a stepper tool, the wafer needs to be flat within one micrometer. Further, it is necessary for the wafer to be flat during handling so that the wafer can be moved through tight spaces without collision. Furthermore, curved wafers give rise to other problems when handled by a robot, for example because they are fragile and it is sometimes difficult to obtain good contact with a vacuum holder when a wafer is curved. It is therefore desirable to keep the wafer flat at all times that the wafer is inside the lithographic apparatus.

SUMMARY OF THE INVENTION

It is an aspect of the present invention to provide a substrate holder that constructed and arranged to hold a relatively small substrate and allow that wafer to be imaged on in a lithographic apparatus having a substrate table adapted to receive a larger substrate and/or to be processed in other substrate processing apparatus adapted for larger substrates.

It is a further aspect of the present invention to provide a substrate holder constructed and arranged to maintain the wafer flat.

The holder of the present invention can be used with substrate, such as silicon wafers, and substrates of other non-magnetic materials.

This and other aspects are achieved according to the present invention in a substrate holder comprising a plate member having a first nominal, or predetermined, size receiveable by a lithographic apparatus, and a clamp constructed and arranged to hold a substrate of a second nominal, or predetermined, size, the second nominal size being smaller than the first nominal size.

Preferably the clamp is adapted to hold the substrate around substantially all of its periphery. This allows the wafer to be kept substantially flat and ensures that good contact with the vacuum system is achieved when holes are provided in the plate member for transmitting the vacuum to the wafer.

By clamping the smaller substrate to a larger plate member, which is of a nominal size, such that it can be processed by a lithographic apparatus, the smaller substrate can be processed by the lithographic apparatus, or other substrate processing apparatus, without modification thereof.

Preferably the plate member is substantially circular in plan and may have one or more flats or notches. The plate member may comprise a silicon wafer of standard dimensions to which the clamp is attached. Alternatively, the plate member may be made of Zerodur (™) or another non-magnetic material of low thermal expansivity.

The first nominal size is preferably 150 mm, 200 or 300 mm or larger. The second nominal size may be 100 mm or smaller. The nominal size in each case is the nominal diameter of the plate member or substrate, disregarding any flats or notches. The substrate and holder need not be round but may be of another shape, e.g. square. In that case, the nominal size is the largest dimension.

The plate member preferably has one or more positioning pins located such that when the substrate is abutted there against, the substrate is located at a predetermined position and/or orientation on the plate member. Where the plate member is provided with one or more flats or notches and the holder is to be used with a substrate having one or more flats or notches, the positioning pins are preferably located such that the flats or notches of the substrate are in a predetermined, preferably corresponding, orientation to the flats or notches of the plate member.

The clamp preferably comprises a ring of magnetic material having an inner contour similar to, but smaller than, the outer contour of the substrate and a plurality of magnets fixed to the plate member. This arrangement ensures even forces are applied to the substrate, helping to keep the substrate flat while enabling the total thickness of the substrate holder to be kept small.

In a preferred embodiment, the plate member is provided with a fine burl pattern in the region on which the substrate is to be placed. The burl pattern prevents short range height variations in the clamped substrate.

According to a further aspect of the invention there, is provided a device manufacturing method including providing a substrate that is at least partially covered by a layer of radiation-sensitive material; projecting a patterned beam of radiation onto a target portion of the layer of radiation-sensitive material, wherein providing the substrate includes clamping the substrate to a plate member having a larger nominal size than the substrate and loading the plate member having the substrate clamped thereto into the lithographic apparatus.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as:particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
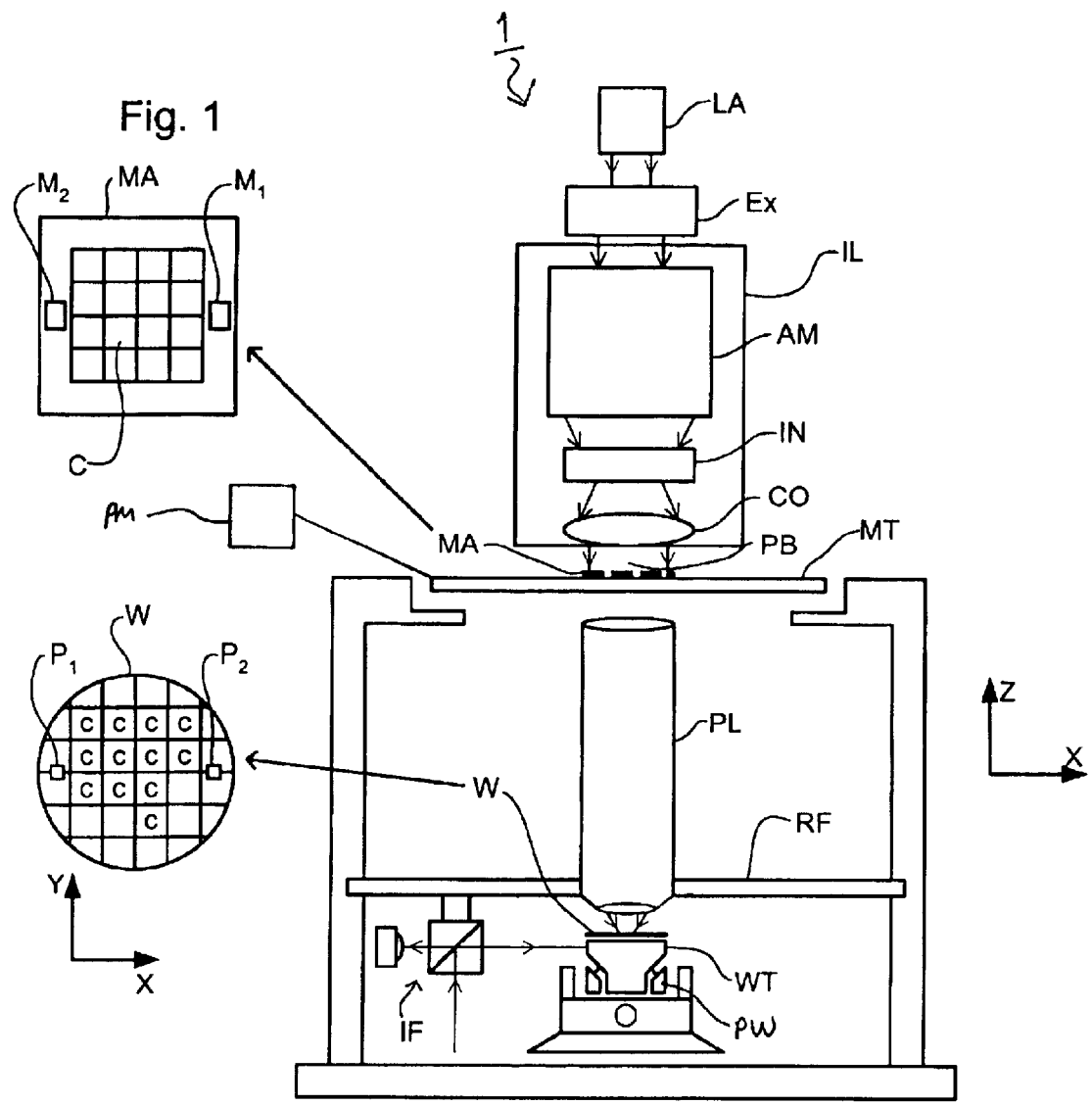
FIG. 1 depicts a lithographic projection apparatus in which embodiments of the present invention may be used.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 170 nm, such as with wavelengths of 157 nm, 126 nm and 13.6 nm, for example.

The beam PB subsequently intercepts the mask MA, which is held on the mask table MT.

Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the socalled "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Such a lithographic apparatus described above may be adapted for use with a substrate (wafer) of particular size, e.g. of nominal diameter 150 mm, 200 mm or 300 mm, and shape, e.g. circular with one or two flats or a notch. In particular, the substrate table will be adapted to receive such a wafer and have a burl pattern of appropriate size and shape and locating pins to fit the notches or flats of the intended substrates. In an apparatus in which the substrate is held on the substrate table by vacuum, the vacuum nozzles will cover the whole area of the substrate to ensure an even clamping force to avoid distorting the substrate. Also, the focal planes of the projection system and various sensors, such as alignment and level sensors, are set at a particular level and the substrate table, which will generally have only a limited range of movement perpendicular to the plane of the substrate, is adapted to position the top surface of a substrate of given thickness at that particular level. If a substrate that is too thin or too thick is used, the substrate table may not be able to adjust its position sufficiently to put the top surface of the substrate in focus of the projection system and the various sensors.

Figure 2:
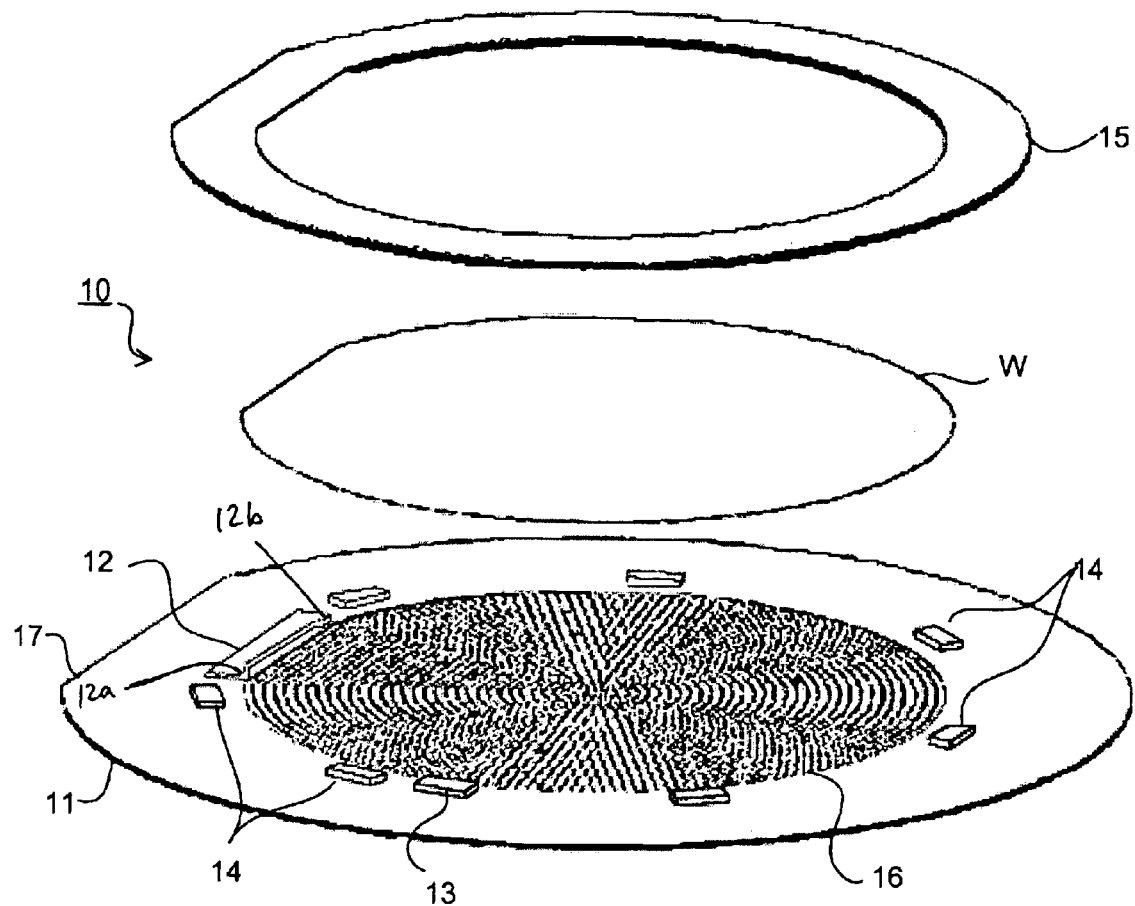
FIG. 2 is an exploded view of a substrate holder according to an embodiment of the present invention together with a substrate.

FIG. 2 is an exploded view of a substrate holder according to an embodiment of the present invention and a substrate. The substrate holder 10 includes a plate member 11, to which are fixed positioning pins 12,13 and permanent magnets 14 which, together with clamp ring 15, form a clamp to hold substrate W firmly in place. A burl pattern 16 is provided to support the substrate W.

The substrate holder 10 enables, for example, a substrate of nominal diameter 100 mm (4") and thickness 140 $\mu$m to be processed in a lithographic projection apparatus, or other substrate processing device, that is adapted to handle substrates of nominal diameter 150 mm (6") and thickness 500 $\mu$m. In addition to being dimensioned to fit the substrate table WT of the lithographic projection apparatus and present the substrate W at a suitable height, the substrate holder 10 ensures that the substrate W, which may be relatively flexible and highly curved due to its thinness, is kept flat for exposure. This is achieved by the fact that the substrate W is clamped by the clamp ring 15 around all, or substantially all, its periphery and by the burl pattern which is sufficiently fine to prevent short range height variations. The clamp ring prevents the substrate W from moving during handling of the substrate holder in the wafer stepper. On the exposure chuck, the system vacuum can be used to clamp both the substrate holder 10 and the substrate W. This is achieved by using holes through the bottom of the plate member 11 which transmit the vacuum to the underside of the substrate W from substrate holder 10.

Figure 4:
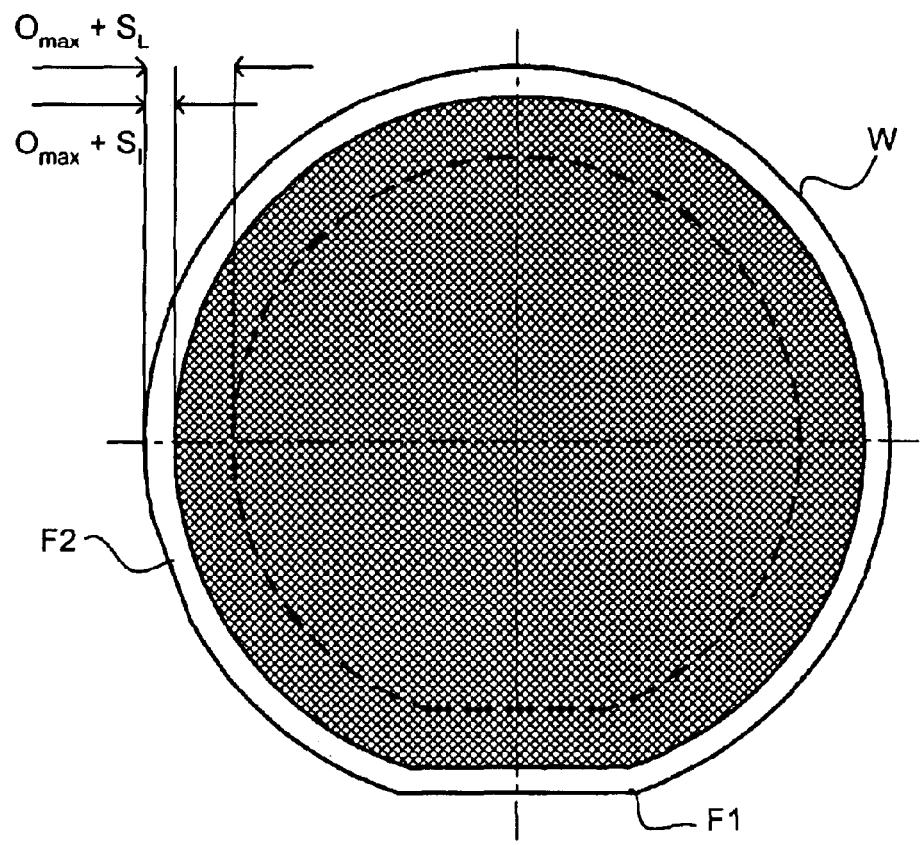
FIG. 4 is a plan view of a substrate showing the areas that can be imaged and measured when the substrate is held in the substrate holder of FIG. 2.

As can be more clearly seen in FIG. 4, the substrate W has a primary flat F1 and can have a secondary flat F2. The positioning pin 12 is located so that the flat F1 abuts against two ends 12a, 12b of the positioning pin 12 to correctly locate the substrate W on the substrate holder 10, which in turn has a flat 17 for location of the substrate holder 10 on the substrate table WT. The positioning pin 13 abuts a point on the wafer edge of another flat F2 to achieve correct positioning. The clamp ring 15 may be provided with recesses in its underside to accommodate the positioning pins 12, 13 and/or the magnets 14.

It will be appreciated that the positioning pins 12, 13 and flats F1, F2, 17 do not have to ensure positioning of the substrate to within the overlap requirements of the lithographic process to be performed but rather need only locate the substrate W sufficiently that alignment markers provided on it are within the capture range of the alignment system of the lithographic apparatus. In other embodiments, the substrate W may have different a number and/or arrangement of flats and/or notches, while the lithographic apparatus may be adapted to receive a substrate with a different a number and/or arrangement of flats and/or notches. In that case, the positioning pins 12,13 on the substrate holder should be so located as to engage with whatever flats and notches are provided on the substrate in order to correctly position the substrate while the plate member 11 should have flats and or notches to engage whatever positioning device or structure is provided on the substrate table of the lithographic projection apparatus. The positioning pins 12, 13 locate the wafer W in the plane of the plate member 11 while the burl pattern locates it in the out of plane direction.

In this embodiment, the plate member 11 comprises a standard 150 mm (6") silicon wafer, the location pins 12, 13 are of ferrite stainless steel and attached to the plate member 11 by an epoxy resin. The magnets 14 are NdFeB permanent magnets plated with NiP and the clamp ring is made of two layers of ferrite stainless steel. The use of two layers enables recesses to receive the magnets and/or positioning pins to be easily provided. Through-holes or cut-outs are made in the clamp ring to form the lower layer only. This is much easier than forming blind shots in a thin ring. Also, one layer can be made of a steel selected for its magnetic properties and the other of a steel selected for strength. Of course, a single layer can be used for the clamp to ensure a minimum height of the clamp.

Figure 3:
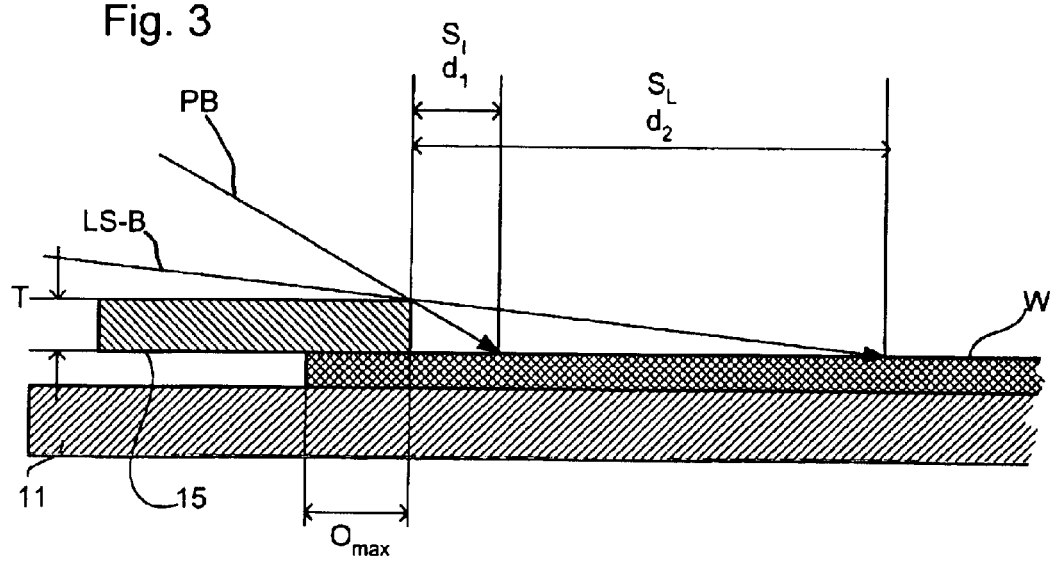
FIG. 3 is a cross-sectional view of part of the substrate holder of FIG. 2 with a substrate clamped therein.

As can be seen from FIG. 3, the height T of the clamp ring 15 will obstruct the projection beam PB if it is attempted to project an image within a distance $d_1$ of the inner periphery of the clamp ring. The exact value of distance $d_1$ will depend on the thickness T and the numeric aperture (NA) of the projection lens PL, which determines the angle of the outermost rays of the projection beam. The width of the annulus that cannot be imaged on will be equal to $d_1$ plus the maximum width $O_{max}$ of the overlap between clamp ring 15 and wafer W. By suitable choice of T and $O_{max}$, the width of the unimageable portion of the substrate, which may be regarded as the shadow $S_1$ of the clamp ring to the projection beam, can be made comparable to the normal edge bead of 3 mm. In a lithographic apparatus with on-axis leveling, the leveling sensor beam LS-B will have a shallower angle of inclination than the projection beam. This means that the shadow $S_{LB}$ of the clamp ring to the leveling sensor beam LS-B will be wider and the vertical position of a larger portion of the wafer surface cannot be measured. This problem can be avoided by extrapolating from leveling measurements made in the inner portion of the substrate W. In FIG. 4, the imageable area is shown cross-hatched and the boundary of the shadow of the level sensor beam is shown as a dashed line.

Figure 5:
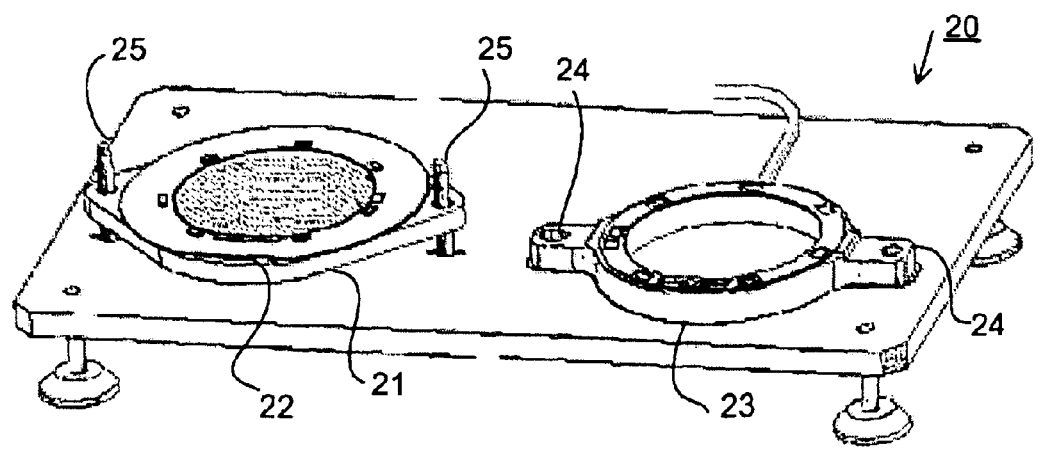
FIG. 5 is a perspective view of a tool for mounting substrates onto the substrate holder of FIG. 2.

A loading tool 20 for loading wafers W onto the substrate holder 10 is shown in FIG. 5. The loading tool has a platform 21 onto which the plate member 11 is placed, e.g. by a wafer handling robot (not shown in FIG. 5) or manually. The platform 21 has a locating bar 22 which engages the flat 17 of the plate member 11 to ensure correct location thereof. Once the plate member 11 is correctly located the wafer W is placed onto the burl pattern and against the positioning pins. Again this can be performed by a wafer handling robot or manually. The wafer W is thereafter clamped by a vacuum to keep it in place. Meanwhile, the clamp ring 15 is held on an annular vacuum chuck 23 by vacuum. The annular vacuum chuck 23 has locator holes 24 on projections that engage with locator pins 25 provided on platform 21 when the annular vacuum chuck 23 is inverted and lowered onto the platform 21 so that the clamp ring is correctly located over the substrate W. The vacuum is then released and the annular vacuum chuck removed, leaving the clamp ring 15 held by magnets 14 to the plate member 11. The substrate holder 11 and held substrate W can then be delivered to the lithographic apparatus, e.g. by wafer handling robot.

The wafer handling robot (known as a wafer handling tool) referred to above can be used to position the plate member 11 correctly on the platform 21 and can also be used to position the substrate W correctly onto plate member 11. A wafer handling robot is preferred to manual handling because manual handling can cause contamination of the wafer W and can result in less precise positioning than is possible using a robot.

Figure 6:
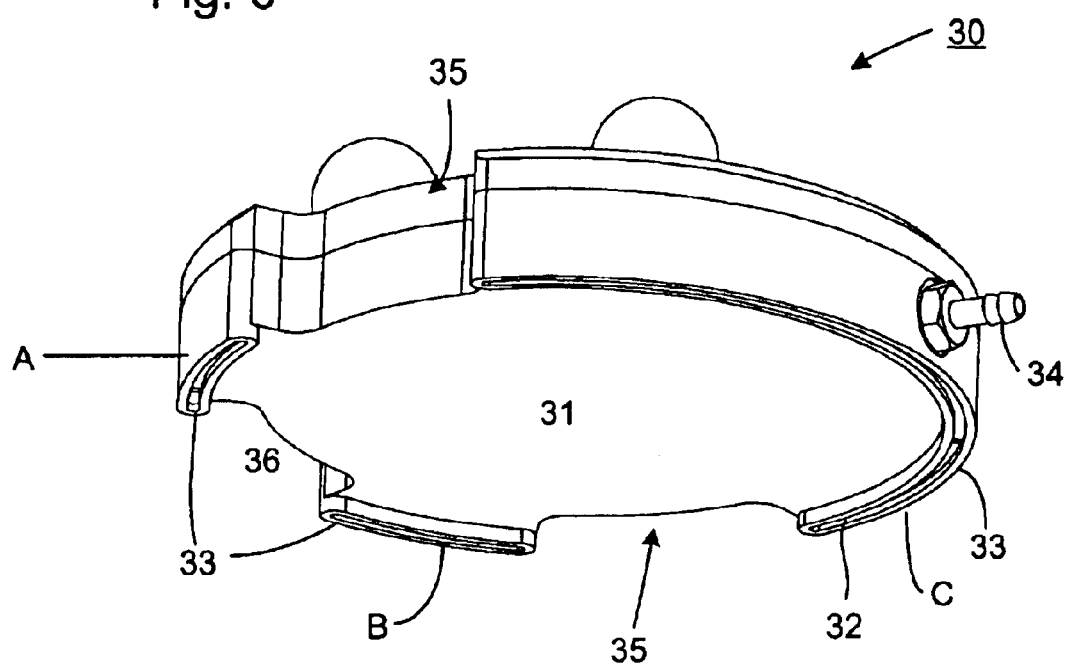
FIG. 6 is a perspective view of a wafer handling tool, as viewed from underneath.

FIG. 6 shows a bottom perspective view of an embodiment of the wafer handling tool 30. The tool comprises a central planar recessed area 31 and a peripheral region 32 that extends out of the plane of the central recessed area 31. The peripheral region 32 is in this embodiment split into three sections A, B, C and is capable of presenting a vacuum to the edge of the wafer. In this embodiment, the vacuum is presented using a circumferential slot 33 formed in the peripheral region 32. Sections A and B of the peripheral region 32 are smaller than Section C. In this embodiment, Sections A and B each span a circumferential range of about 30° and Section C spans a circumferential range of about 160°.

Each of the three peripheral regions A, B, C shown in FIG. 6 can be connected by holes inside the tool to a vacuum connector 34 which in turn is connected to a vacuum pump system or the like.

The vacuum slots, or chambers, 33 in the peripheral region 32 are preferably located such that, in use, only the outer edge of the wafer is in contact with the tool. The recessed central area 31 prevents the wafer touching any other part of the tool. As will be seen in FIG. 6, there are gaps 35, 36 at certain positions around the circumference of the tool and this is to allow the wafer to be pressed against fixed points on the wafer holder surface. For example, for a wafer having flats F1 and F2, the tool 30 can pick the wafer up with the flat F1 being exposed in gap 36 and with flat F2 being exposed in one of the gaps 35 and this aids in setting the wafer down again onto the plate member 11. The gaps 35 and 36 also help to visually verify that the wafer is positioned correctly against the positioning pins 12, 13.

The wafer handling tool 30 is preferably made from a plastics material because such materials are easy to manufacture and do not damage the wafer surface. Polycetals, eg. polyoxymethylene (POM), are particularly suitable.

The wafer handling tool 30 allows the wafer to be handled from the top, instead of the bottom. This is made possible by the use of the peripheral vacuum chambers 33 that do not interact with the useable central portion of the wafer. The tool can be used in various situations where it is not possible or desirable to handle the wafer from below. For example, a wafer needs to be positioned on a surface in which there is no room for a backside tool; the wafer has to be removed from the surface it has stuck to or where there is no room for the standard tool; there are device or other sensitive components on the backside of the wafer.

The peripheral vacuum chamber design of the tool allows very fragile and thin wafers to be handeled in a reliable way. Furthermore, it has been found that the tool itself helps to flatten curved wafers which makes later positioning of the wafer much easier and more reliable.

While specific embodiments of the invention have been described above, it will be appreciated that the invention may be practiced otherwise than as described. The description is not intended to limit the invention.

What is claimed is:

1. A substrate holder, comprising
    a plate member having a first nominal size receivable by a lithographic apparatus, said plate member having a receiving surface on which a substrate of a second nominal size is disposed, and said plate member being configured to substantially entirely support a lower surface of said substrate; and
    a clamp constructed and arranged to hold said substrate of a second nominal size on the plate member, the second nominal size being smaller than the first nominal size,
    wherein said lithographic apparatus is originally configured to expose substrates having substantially said first nominal size, and
    wherein the clamp comprises a ring of magnetic material having an inner contour similar to but smaller than the outer contour of the substrate of a second nominal size and a plurality of magnets are fixed to the plate member.

2. A substrate holder according to claim 1, wherein the clamp is adapted to hold the substrate of a second nominal size around substantially an entire periphery of the substrate.

3. A substrate holder according to claim 1, wherein a portion of the substrate of a second nominal size that is not imaged during exposure with said lithographic apparatus is a peripheral portion of about 3 mm wide.

4. A substrate holder according to claim 1, wherein the plate member comprises a silicon wafer to which the clamp is attached.

5. A substrate holder according to claim 1, wherein the plate member is substantially circular and includes one or more flats or notches.

6. A substrate holder according to claim 1, wherein the first nominal size is 150 mm or larger and the second nominal size is 100 mm or smaller.

7. A substrate holder according to claim 1, wherein the plate member has one or more positioning pins located such that when the substrate is abutted against the one or more positioning pins the substrate is located at a predetermined position and orientation on the plate member.

8. A substrate holder according to claim 7, for use with a substrate having one or more flats or notches, wherein the plate member is provided with one or more flats or notches and the one or more positioning pins are located such that the one or more flats or notches of the substrate are in a predetermined, corresponding orientation to the one or more flats or notches of the plate member.

9. A substrate holder according to claim 1, wherein the plate member includes a burl pattern in a region on which the substrate is to be held.

10. A method of operating a substrate holder according to claim 1, the method comprising:
    locating the plate member on a platform;
    placing the substrate on the plate member in a correct orientation;
    locating the clamp on a chuck; and
    lowering the chuck onto the platform to locate the clamp over the substrate to thereby clamp the substrate to the plate member.

11. A method according to claim 10, wherein the lowering comprises:

locating holes in the chuck with pins on the platform to align the clamp, the substrate and the plate member.

12. A method according to claim 10, wherein locating the clamp on a chuck includes applying a vacuum to the chuck.

13. A device manufacturing method, comprising:

disposing a substrate on a receiving surface of a plate member, said plate member being configured to substantially entirely support a lower surface of said substrate;

clamping the substrate to the plate member, said plate member having a first nominal size larger than a second nominal size of the substrate;

loading the plate member having the substrate clamped thereto in a lithographic apparatus; and projecting a patterned beam of radiation onto a target portion of a layer of radiation-sensitive material disposed on an upper surface of said substrate wherein said lithographic apparatus is originally configured to expose substrates having substantially said first nominal size, and wherein the substrate is clamped to the plate member magnetically.

14. A device manufacturing method according to claim 13, wherein clamping the substrate comprises clamping the substrate around substantially an entire periphery of the substrate.

15. A device manufacturing method according to claim 13, wherein providing the substrate further comprises:

abutting the substrate against one or more positioning pins on the plate member such that when the substrate is abutted against the one or more positioning pins the substrate is located at a predetermined position and orientation on the plate member.

16. A device manufacturing method according to claim 15, wherein the plate member is provided with one or more flats or notches and the one or more positioning pins are located such that the one or more flats or notches of the substrate are in a predetermined, corresponding orientation to the one or more flats or notches of the plate member.

17. A device manufacturing method according to claim 13, wherein providing the substrate further comprises locating the substrate on a burl pattern on the plate member.

18. A device manufacturing method according to claim 13, wherein loading the plate member having the substrate clamped thereto in a lithographic apparatus comprises:

locating the plate member on a platform;

placing the substrate on the plate member in a correct orientation;

locating the clamp on a chuck; and lowering the chuck onto the platform to locate the clamp over the substrate to thereby clamp the substrate to the plate member.

\* \* \* \* \*